(12) United States Patent
Korenstein et al.

(10) Patent No.: US 7,989,261 B2
(45) Date of Patent: Aug. 2, 2011

(54) FABRICATING A GALLIUM NITRIDE DEVICE WITH A DIAMOND LAYER

(75) Inventors: Ralph Korenstein, Framingham, MA (US); Steven D. Bernstein, Brighton, MA (US); Stephen J. Pereira, Hopedale, MA (US)

(73) Assignee: Raytheon Company, Waltham, MA (US)

( * ) Notice: Subject to any disclaimer, the term of this patent is extended or adjusted under 35 U.S.C. 154(b) by 267 days.

(21) Appl. No.: 12/341,115

(22) Filed: Dec. 22, 2008

(65) Prior Publication Data

US 2010/0155900 A1    Jun. 24, 2010

(51) Int. Cl.
*H01L 21/00* (2006.01)

(52) U.S. Cl. ... 438/105; 438/48; 438/590; 438/E21.248; 257/77; 257/78

(58) Field of Classification Search .................. 438/105; 257/40, 77–78, 191–194, 280, 613
See application file for complete search history.

(56) References Cited

U.S. PATENT DOCUMENTS

| | | | |
|---|---|---|---|
| 5,252,840 A | 10/1993 | Shiomi et al. | |
| 5,277,975 A | 1/1994 | Herb et al. | |
| 5,633,516 A | 5/1997 | Mishima et al. | |
| 5,726,463 A | 3/1998 | Brown et al. | |
| 5,962,345 A | 10/1999 | Yen et al. | |
| 6,063,187 A * | 5/2000 | Lee et al. | 117/101 |
| 6,255,712 B1 | 7/2001 | Clevenger et al. | |
| 2003/0170458 A1 | 9/2003 | Noguchi | |
| 2005/0139838 A1 | 6/2005 | Murata et al. | |
| 2006/0081985 A1 | 4/2006 | Beach et al. | |
| 2006/0113546 A1 | 6/2006 | Sung | |
| 2007/0126026 A1 | 6/2007 | Ueno et al. | |
| 2007/0272929 A1 | 11/2007 | Namba et al. | |
| 2008/0181550 A1 | 7/2008 | Earnshaw | |
| 2008/0206569 A1 | 8/2008 | Whitehead et al. | |
| 2009/0146186 A1 * | 6/2009 | Kub et al. | 257/194 |
| 2010/0001292 A1 | 1/2010 | Yamasaki et al. | |
| 2010/0155901 A1 | 6/2010 | Korenstein et al. | |
| 2010/0187544 A1 | 7/2010 | Korenstein et al. | |
| 2010/0216301 A1 | 8/2010 | Chen et al. | |

FOREIGN PATENT DOCUMENTS

| | | |
|---|---|---|
| EP | 0 457 508 | 11/1991 |
| EP | 2 015 353 A1 | 1/2009 |
| JP | 2005 210105 | 8/2005 |
| JP | 2005 210105 A | 8/2005 |
| WO | WO 2006/117621 | 11/2006 |

(Continued)

OTHER PUBLICATIONS

Notification of International Search Report and Written Opinion of the International Searching Authority for PCT/US2009/068180, dated Mar. 16, 2010, 9 pages.

(Continued)

*Primary Examiner* — Dung A. Le

(74) *Attorney, Agent, or Firm* — Daly, Crowley, Mofford & Durkee, LLP

(57) ABSTRACT

In one aspect, a method includes fabricating a device. The device includes a gallium nitride (GaN) layer, a diamond layer disposed on the GaN layer and a gate structure disposed in contact with the GaN layer and the diamond layer.

In another aspect, a device includes a gallium nitride (GaN) layer, a diamond layer disposed on the GaN layer and a gate structure disposed in contact with the GaN layer and the diamond layer.

15 Claims, 11 Drawing Sheets

FOREIGN PATENT DOCUMENTS

| WO | WO 2007/122507 | 11/2007 |
|----|----------------|---------|
| WO | WO 2008/147538 | 12/2008 |

OTHER PUBLICATIONS

Notification of International Search Report and Written Opinion of the International Searching Authority for PCT/US2009/068178, dated Mar. 16, 2010, 11 pages.

U.S. Appl. No. 12/341,191, filed Dec. 22, 2008, file through May 3, 2010, 307 pages.

U.S. Appl. No. 12/753,354, filed Apr. 2, 2010, file through May 3, 2010, 354 pages.

U.S. Appl. No. 12/390,593, filed Feb. 23, 2009, file through May 3, 2010, 179 pages.

Notification of Transmittal of the International Search Report and the Written Opinion of the International Searching Authority, or the Declaration, PCT/US2010/024878 dated Jun. 7, 2010, 5 pages.

Written Opinion of the International Searching Authority, PCT/US2010/024878 dated Jun. 7, 2010, 6 pages.

Baik, et al. "Control of diamond micro-tip geometry for field emitter", Thin Solid Films, vol. 377-378 Dec. 2000, XP004226709, pp. 299-302.

Choi et al., "Properties of natural diamond microlenses fabricated by plasma etching", Industrial Diamond Review, Issue 2, 2005, p. 29, 30, 32 (3 pages).

U.S. Appl. No. 12/341,191, filed Dec. 22, 2008, file May 4, 2010 through Sep. 30, 2010, 74 pages.

U.S. Appl. No. 12/753,354, filed Apr. 2, 2010, file May 4, 2010 through Sep. 30, 2010, 45 pages.

U.S. Appl. No. 12/390,593, filed Feb. 23, 2009, file May 4, 2010 through Sep. 30, 2010, 85 pages.

Francis, et al., "GaN-HEMT Epilayers on Diamond Substrates: Recent Progress", CS ManTech 2007, 4 pages.

\* cited by examiner

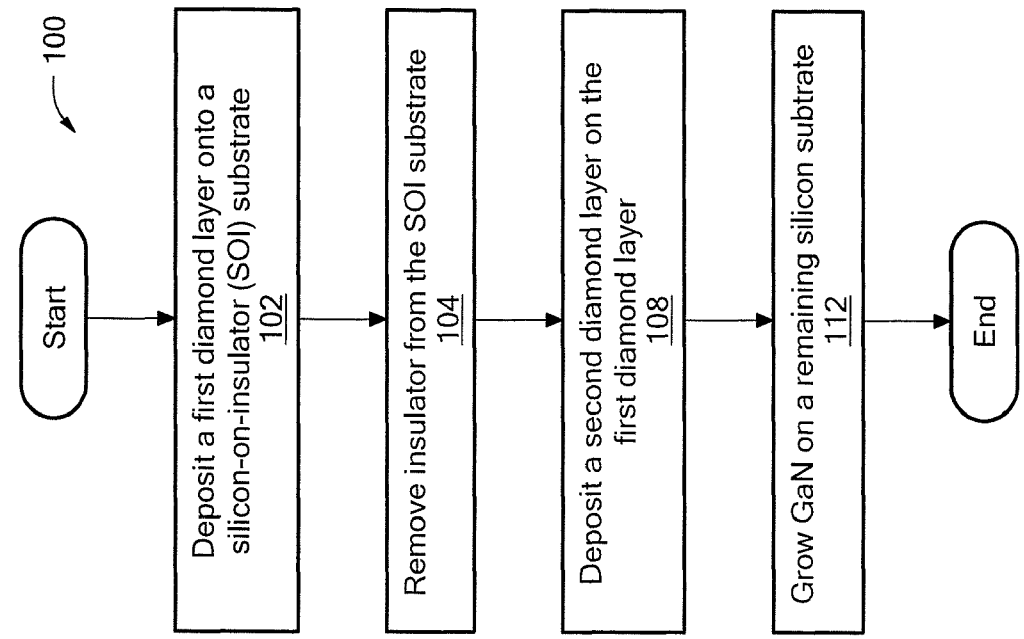
*FIG. 2*
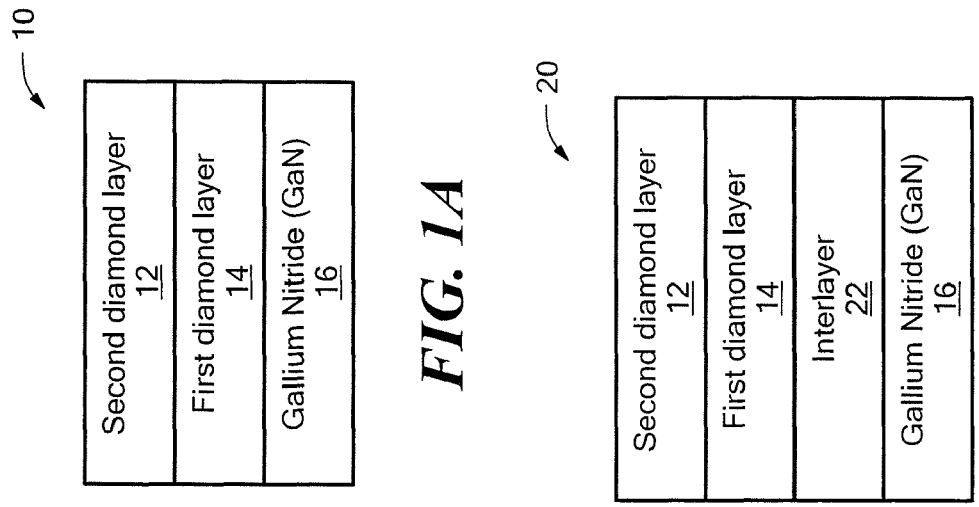
*FIG. 1A*
*FIG. 1B*

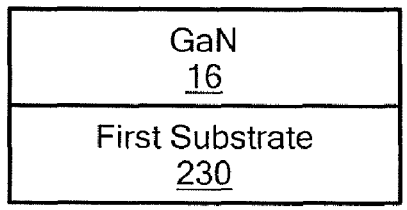
*FIG. 5A*
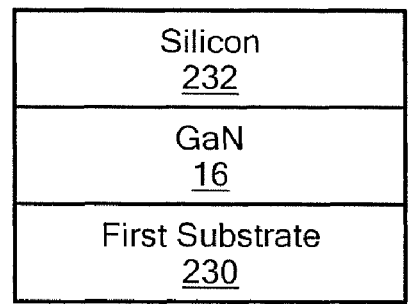
*FIG. 5B*
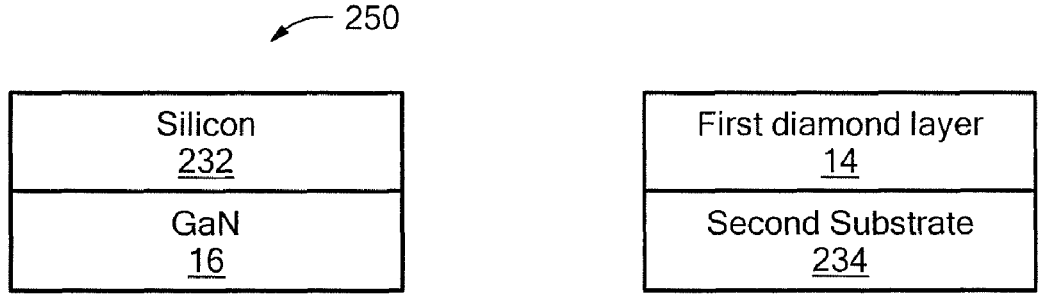
*FIG. 5C*   *FIG. 5D*

FABRICATING A GALLIUM NITRIDE DEVICE WITH A DIAMOND LAYER

BACKGROUND

Gallium Nitride (GaN) has electrical and physical properties that make it highly suitable for high frequency (HF) devices such as microwave devices. The HF devices produce a high amount of heat requiring a heat spreader to be attached to the HF devices to avoid device failure. One such heat spreader is diamond. A hot filament chemical vapor deposition (CVD) process has been used to form diamond that is used on GaN layers. Generally, these diamond layers are not deposited directly onto the GaN layers but onto some other material (e.g., silicon, silicon carbide, and so forth) that is eventually disposed with the GaN layer.

SUMMARY

In one aspect, a method includes fabricating a device. The device includes a gallium nitride (GaN) layer, a diamond layer disposed on the GaN layer and a gate structure disposed in contact with the GaN layer and the diamond layer.

In another aspect, a device includes a GaN layer, a diamond layer disposed on the GaN layer and a gate structure disposed in contact with the GaN layer and the diamond layer.

In a further aspect, a method includes disposing a diamond layer onto a first surface of gallium nitride (GaN), removing a portion of the diamond layer exposing the first surface of the GaN and forming a gate structure in contact with the first surface of the GaN and the diamond layer.

DESCRIPTION OF THE DRAWINGS

FIG. 1A is a diagram of an example of a Gallium Nitride (GaN) layer with a first diamond layer and a second diamond layer.

FIG. 1B is a diagram of another example of the GaN layer with the first diamond layer and the second diamond layer.

FIG. 2 is a flowchart of an example of a process to fabricate the GaN layer with the first diamond layer and the second diamond layer.

FIGS. 5A to 5H are diagrams corresponding to the process of FIG. 4.

DETAILED DESCRIPTION

Figure 3A:
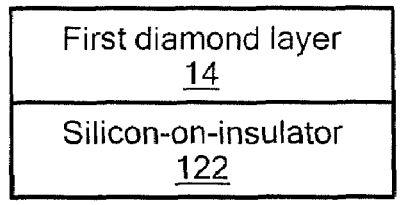
FIGS. 3A to 3D are diagrams corresponding to the process of FIG. 2.

Hot filament chemical vapor deposition (CVD) processes have been used to form diamond layers of less than 1 mil that are used on gallium nitride (GaN) layers. To be effective as a heat spreader, diamond layers must be greater than 2 mils. Moreover, the hot filament CVD process by its very nature produces a blackish-color diamond which is contaminated with material used in the hot filament CVD process such as tungsten, for example. In general, these "dirty" diamond layers that are produced have a lower thermal conductivity than pure diamond. In general, the thermal conductivity of diamond layers using the hot filament CVD process is about 800 to 1000 Watts/meter-Kelvin (W/m-K).

A microwave plasma CVD process has been known to produce much thicker diamond layers on the order of 4 mils or greater at a much faster rate than the hot filament CVD process. Moreover the diamond layers are purer than the hot filament CVD process producing diamond layers having a thermal conductivity greater than 1500 W/m-K. In one example, the thermal conductivity of diamond produced using the microwave plasma CVD process is twice the thermal conductivity of diamond produced using the hot filament process. However, the CVD processes including the microwave plasma CVD process is relatively unknown with respect to direct deposition onto GaN. For example, the deposition of diamond using hot filament CVD is typically done onto some other material (e.g., silicon, silicon carbide, and so forth) that is eventually disposed with the GaN layer. Since the deposition of diamond directly onto to GaN using the microwave plasma CVD process is relatively unknown, the costs of developing and testing a reliable and successful processes to deposit diamond directly onto the GaN is extremely expensive. One way around the cost and expense of developing a process to deposit diamond directly onto GaN, is to deposit diamond using the microwave plasma CVD process onto an inferior diamond layer that was fabricated using the hot filament CVD, for example.

As used herein GaN layers may include pure GaN, doped GaN or GaN combined with other elements (e.g., AlGaN) or any combination thereof. Silicon substrates may include pure silicon, doped silicon, silicon dioxide, silicon carbide or any combination of silicon with other elements or any combination thereof.

Referring to FIGS. 1A and 1B, in one example, a structure 10 for use in forming a device (e.g., a high frequency device, a high electron mobility transistor (HEMT), a microwave device and so forth) includes a second diamond layer 12, a first diamond layer 14 adjacent to the second diamond layer and a GaN layer 16 adjacent to the first diamond layer. In this configuration, heat produced by GaN layer 16 pass through a heat spreader formed by the first and second diamond layers 12, 14. In another example, a structure 20 uses to form a device (e.g., a high frequency device, a HEMT transistor, a microwave device and so forth) is similar to the structure 10 but includes an interlayer 22 between the first diamond layer and the GaN layer 16. The interlayer 22 is needed because the fabrication of diamond directly onto GaN is not easy process much less predictable or consistent. The interlayer 22 may be simply an adhesive holding the first diamond layer 14 to the GaN 16 or a silicon-type structure onto which diamond may easily be disposed. Sometimes the interlayer 22 has a thermal conductivity less than that of the diamond layers 12, 14 so that it holds heat more; or put another way, the heat transference from the GaN layer 16 is impeded by the interlayer 22. Thus, minimizing the interlayer 22 or not having the interlayer at all as in the structure 10 is preferred.

Figure 3B:
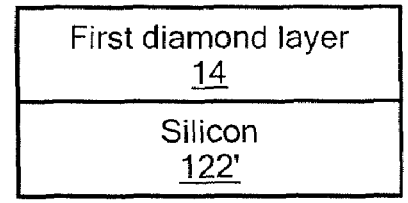
Figure 3C:
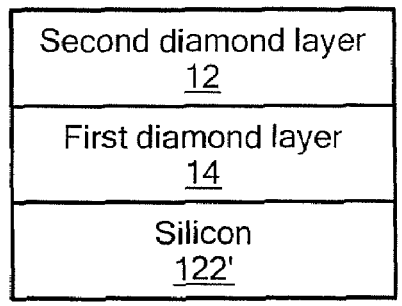
Figure 3D:
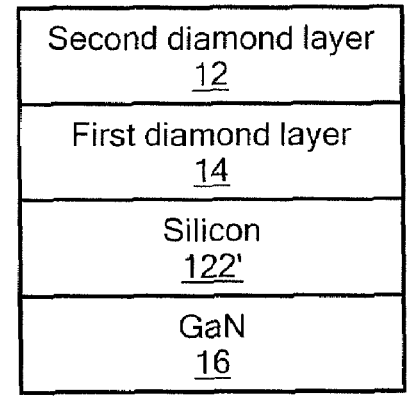
Figure 4:
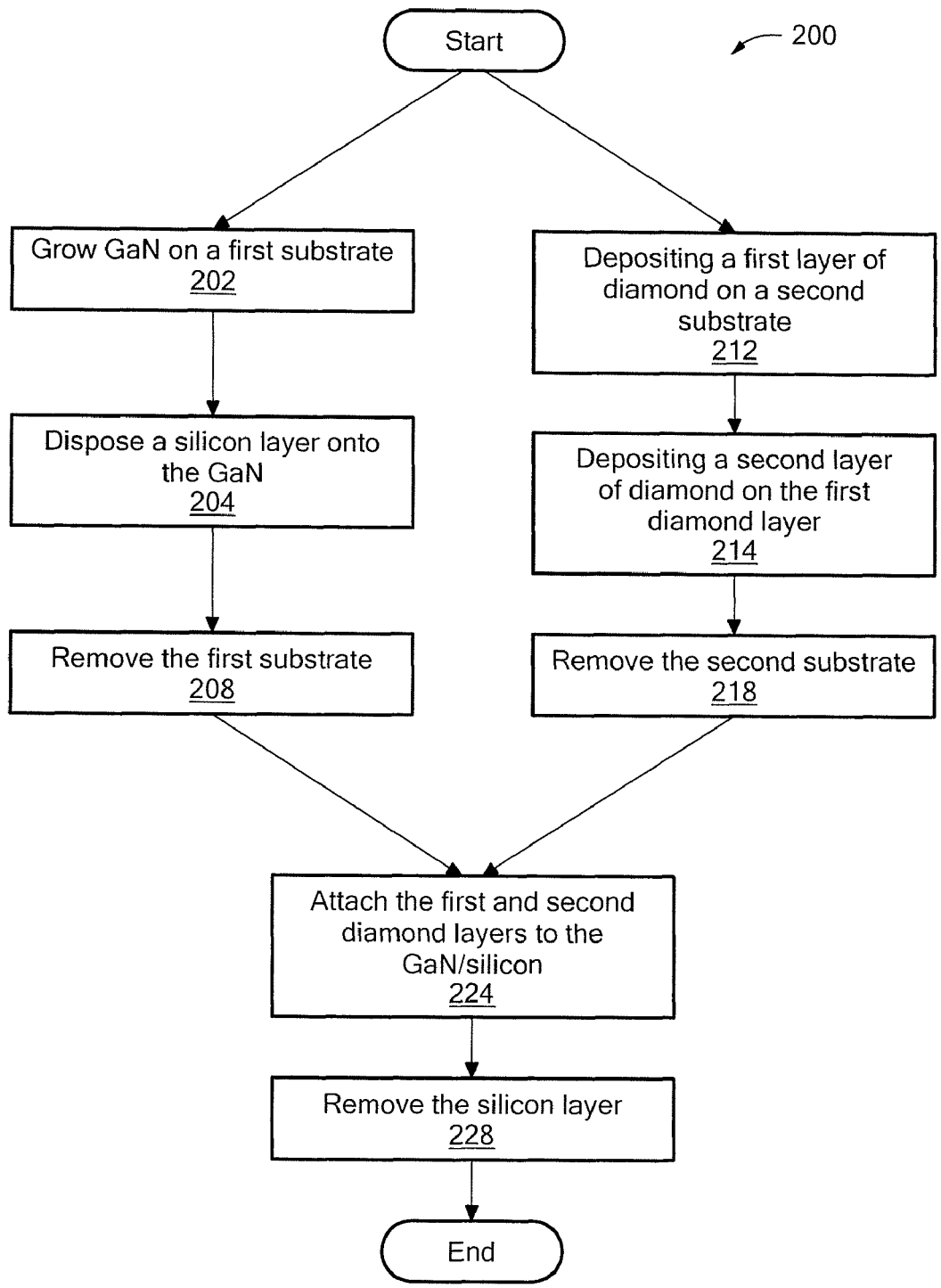
FIG. 4 is a flowchart of another example of a process to fabricate a GaN layer with the first diamond layer and the second diamond layer.

Referring to FIGS. 2 and 3A to 3D, one process to fabricate a GaN layer with a first diamond layer and a second diamond layer is a process 100. The hot filament CVD process is used to deposit a first diamond layer 14 (e.g., a layer of 5 to 20 microns thick) onto a silicon-on-insulator (SOI) substrate 122 (102) (FIG. 3A). The insulator (not shown) (e.g., silicon dioxide) is removed from the SOI substrate 122 leaving a silicon substrate 122', for example (104) (FIG. 3B). The microwave plasma CVD is used to deposit a second diamond layer 12 onto the first diamond layer 14 (108) (FIG. 3C). GaN is grown onto the remaining SOI substrate, the silicon substrate 122 (112) (FIG. 3D).

Figure 5E:
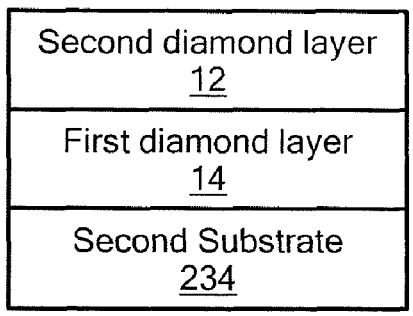
Figure 5F:
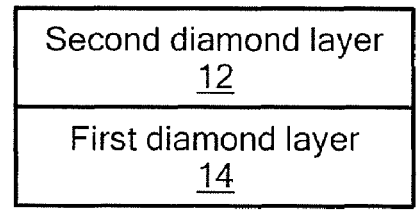
Figure 5G:
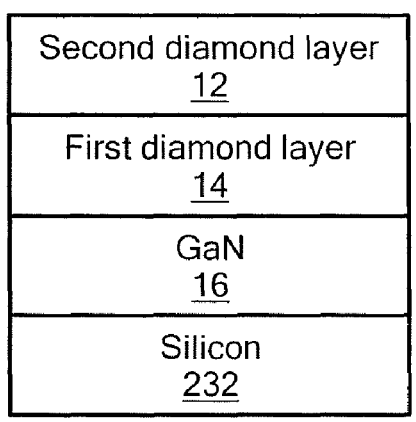
Figure 5H:
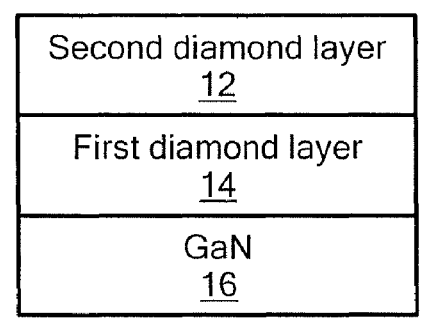
Figure 6:
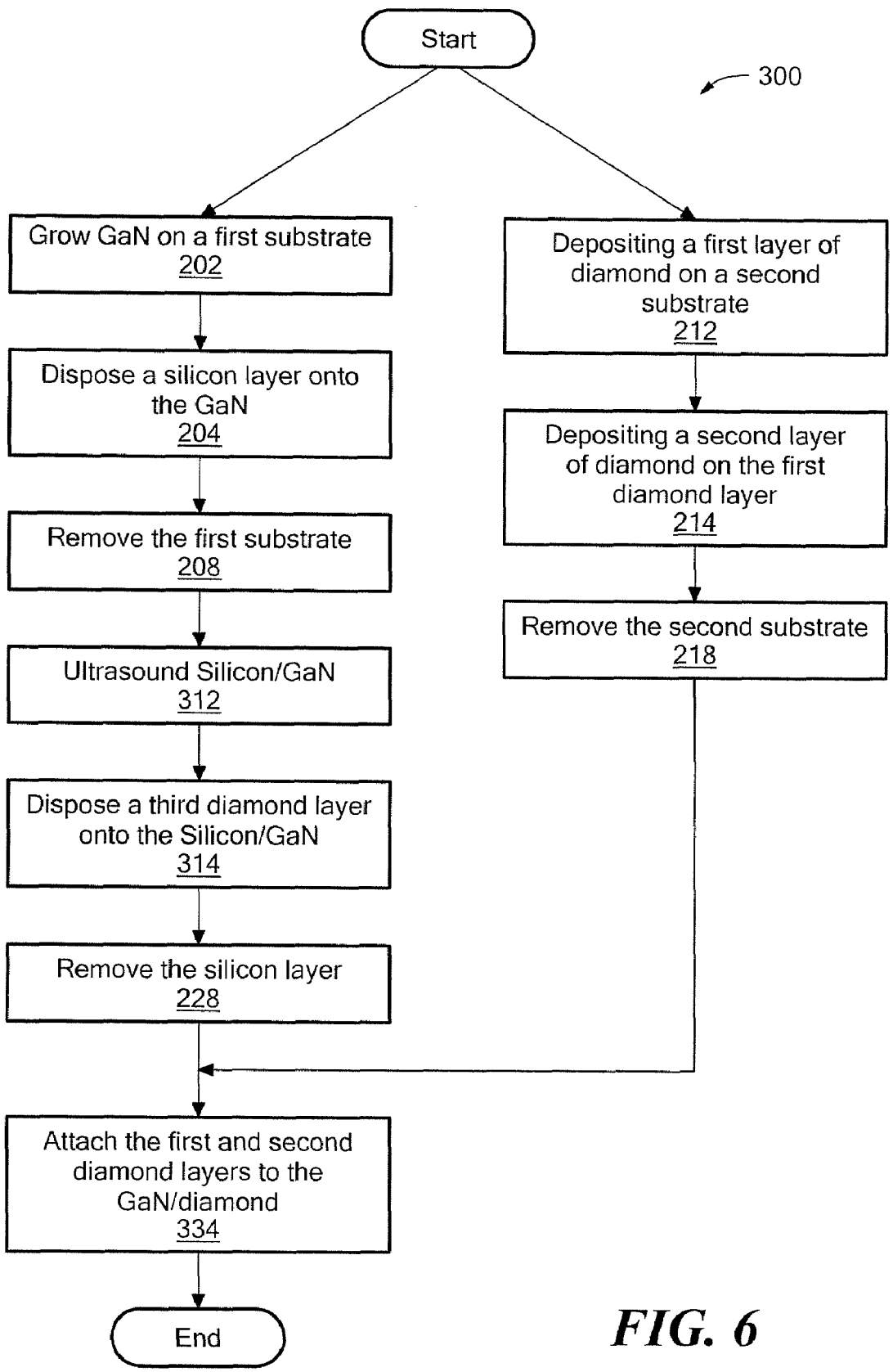
FIG. 6 is a flowchart of an example of a process for depositing diamond on another surface.

Referring to FIGS. 4 and 5A to 5H, another process to fabricate a GaN layer with a first diamond layer and a second diamond layer is a process 200. GaN 16 is grown on a first substrate 230 (202) (FIG. 5A). In one example, the first substrate may be silicon carbide, silicon or sapphire. A silicon layer 232 (e.g., silicon, silicon carbide and so forth) is disposed onto the GaN (204) (FIG. 5B). In one example, the silicon layer 232 is attached to the GaN 16 using an adhesive. In another example, the silicon layer 232 is grown onto the GaN 16. In other examples, other materials such as glass may be used instead of the silicon layer 232. The first substrate 230 is removed (208), for example, through etching leaving a GaN/silicon structure 250 (FIG. 5C). A hot filament CVD is used to deposit a first layer of diamond 14 onto a second substrate 234 (212) (FIG. 5D). For example, the second substrate 234 is a silicon substrate 500 microns thick. A microwave plasma CVD process is used to deposit a second diamond layer 12 onto the first diamond layer 14 (218) (FIG. 5E). The second substrate 234 is removed (218), for example, through etching (FIG. 5F). The first and second diamond layers 12, 14 are attached to the GaN/silicon structure 250 (224) (FIG. 5G). For example, the first diamond layer 14 is attached to the GaN 16 using an adhesive. The silicon layer 232 is removed (228), for example, through etching (FIG. 5H).

Figure 7A:
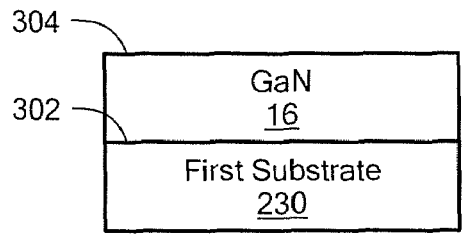
FIGS. 7A to 7F are diagrams corresponding to the process of FIG. 6.
Figure 7B:
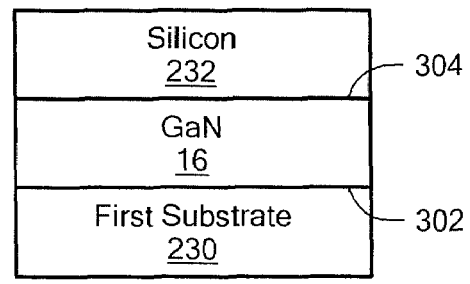
Figure 7C:
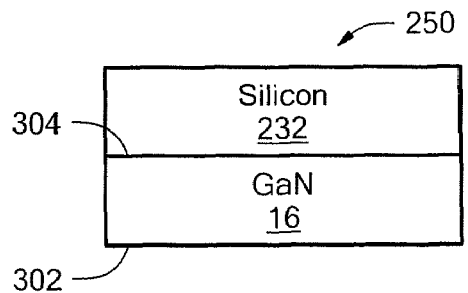

Referring to FIG. 6 and 7A to 7F, a further process to fabricate a GaN layer with diamond layers is a process 300. Process 300 is similar to process 200 except a third diamond layer 316 is disposed on a first GaN surface 302 (e.g., a top surface) (FIG. 7F) opposite a second GaN surface 304 (e.g., a bottom surface) (FIG. 7F) that has the first and second diamond layers 14, 12. For example, processing blocks 202, 204 and 208 are performed as in process 200. In particular, the GaN 16 is grown on the first substrate 230 (202) (FIG. 7A), the silicon layer 232 is disposed onto the GaN 16 (204) (FIG. 7B); and the first substrate 230 is removed (208), for example, through etching leaving the GaN/silicon structure 250 (FIG. 7C).

The silicon/GaN structure 250 is immersed in a solution and subjected to ultrasound (302). By treating the surface prior to deposition (e.g., a processing block 314), the diamond layer 316 has a better chance of forming on the GaN 16 during deposition. In one example, the solution is an isopropyl alcohol solution that includes diamond particles (e.g., nano-diamond particles ($10^{-9}$ m)).

Figure 7D:
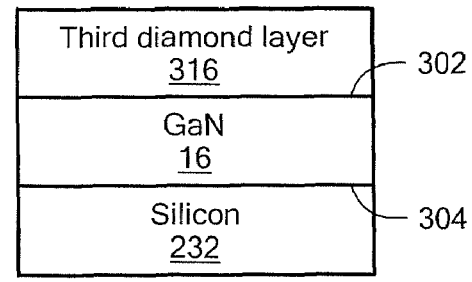
Figure 7E:
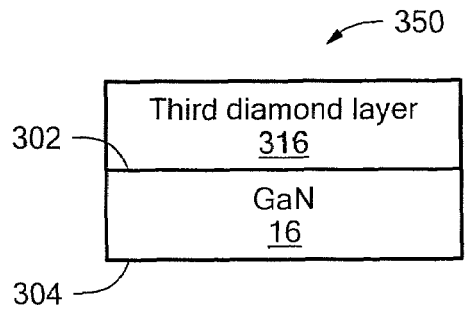

The third diamond layer 316 is disposed on the silicon/GaN structure 250 (314) (FIG. 7D). For example, the microwave plasma CVD process is used to deposit the third diamond layer 316 onto the GaN 250 at temperatures from about 600° C. to about 650° C. The silicon layer 232 is removed (228), for example, through etching (FIG. 7E).

Figure 7F:
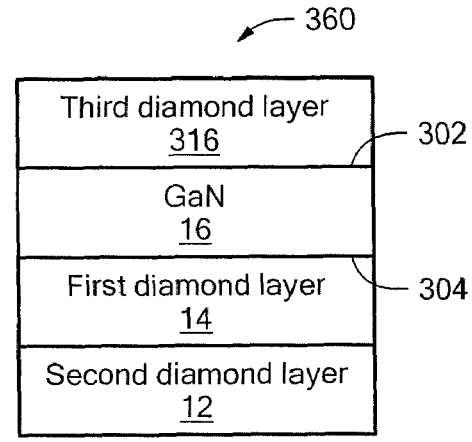
Figure 8:
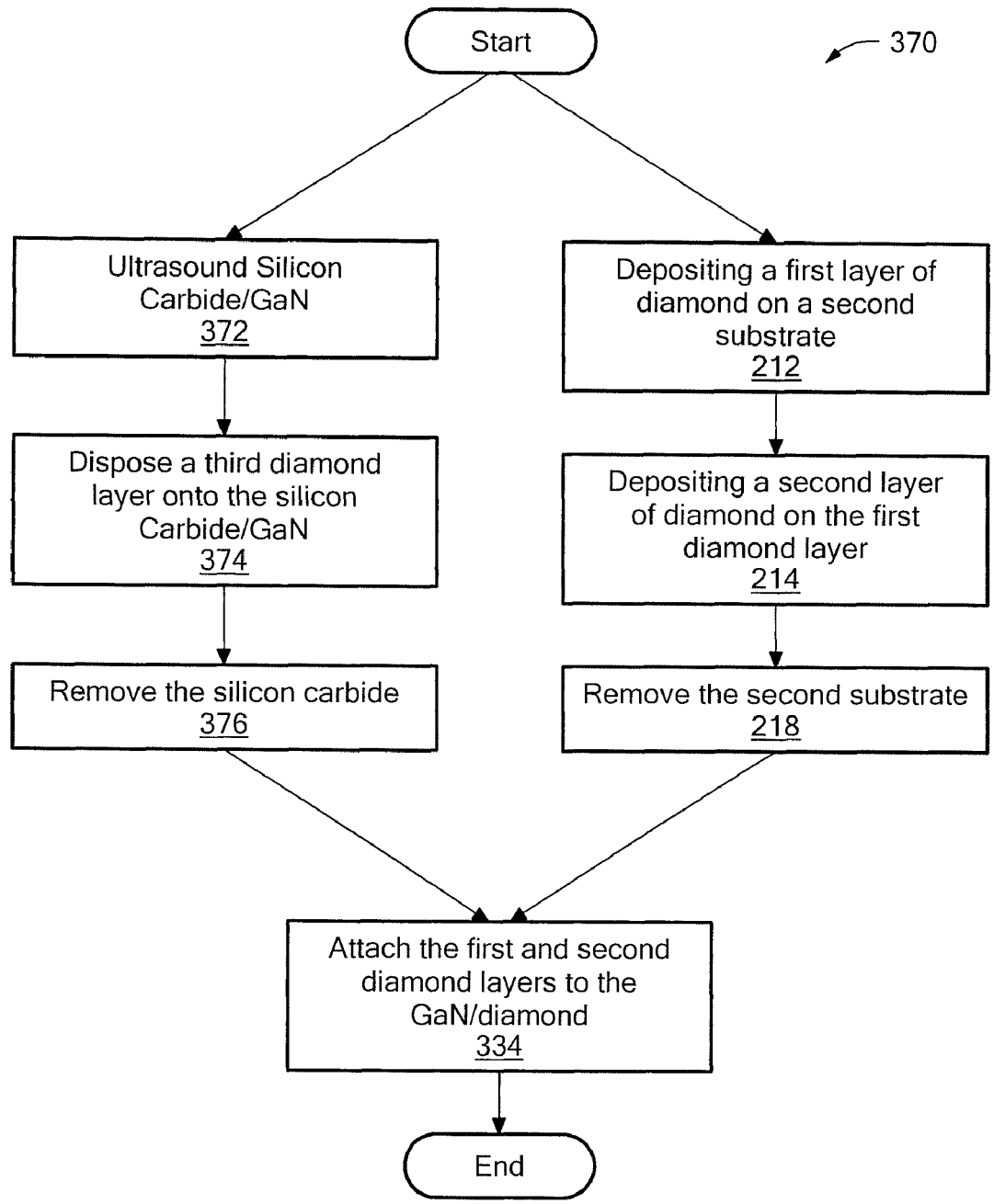
FIG. 8 is a flowchart of another example of a process for depositing diamond on another surface.

The first and second diamond layers 14, 12, formed using process blocks 212, 214 and 218, for example, are attached to the remaining GaN/diamond structure to form a diamond/GaN/diamond/diamond structure 360 (334) (FIG. 7F). For example, the first diamond layer 14 is attached to the GaN 16 using an adhesive. The first diamond layer 14 is attached to the second surface 304 opposite to the first surface 302 disposed with the third diamond layer 316. By having a diamond layer 316 disposed on opposite surfaces from the diamond layers 12, 14, heat is more effectively pulled away from devices formed from the diamond/GaN/diamond/diamond structure 360.

Figure 9A:
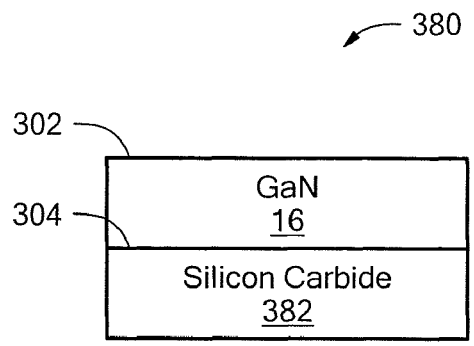
FIGS. 9A to 9D are diagrams corresponding to the process of FIG. 6.
Figure 9B:
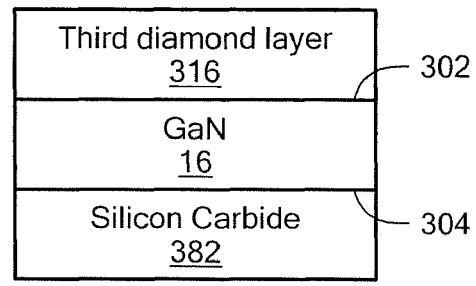
Figure 9C:
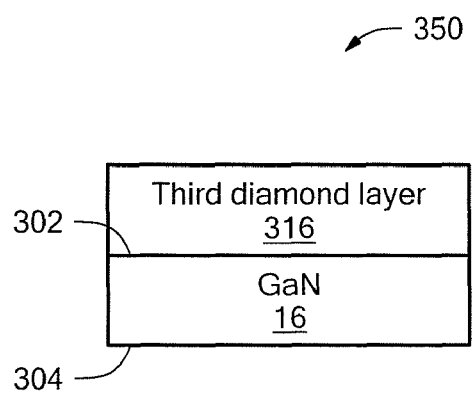
Figure 9D:
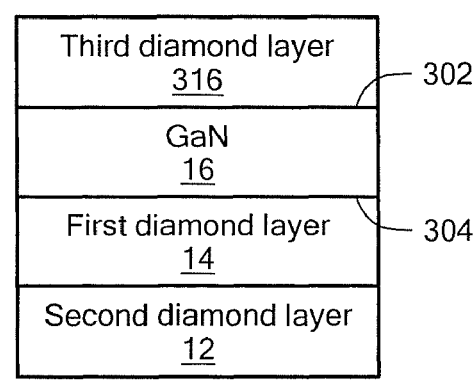

Referring to FIG. 8 and 9A to 9D, a still further process to fabricate a GaN layer with diamond layers is a process 370. A silicon carbide/GaN structure 380 (FIG. 9A) that includes a GaN layer 16 and a silicon carbide layer 382 disposed with the second surface of the GaN 16. The silicon carbide/GaN structure 380 is immersed in an isopropyl alcohol solution with nano-diamond particles (e.g., a solution used in processing block 312) and an ultrasound is performed (372). A third diamond layer 316 is disposed on the GaN 16 (374) (FIG. 9B). The silicon carbide layer 382 is removed, for example, through etching (376) (FIG. 9C). The first and second diamond layers 14, 12 are formed using processing blocks 212, 214, and 218, for example. The first and second diamond layers 14, 12 are attached to the GaN/diamond 350 to form the diamond/GaN/diamond/diamond structure 360 (334) (FIG. 9D).

Figure 10:
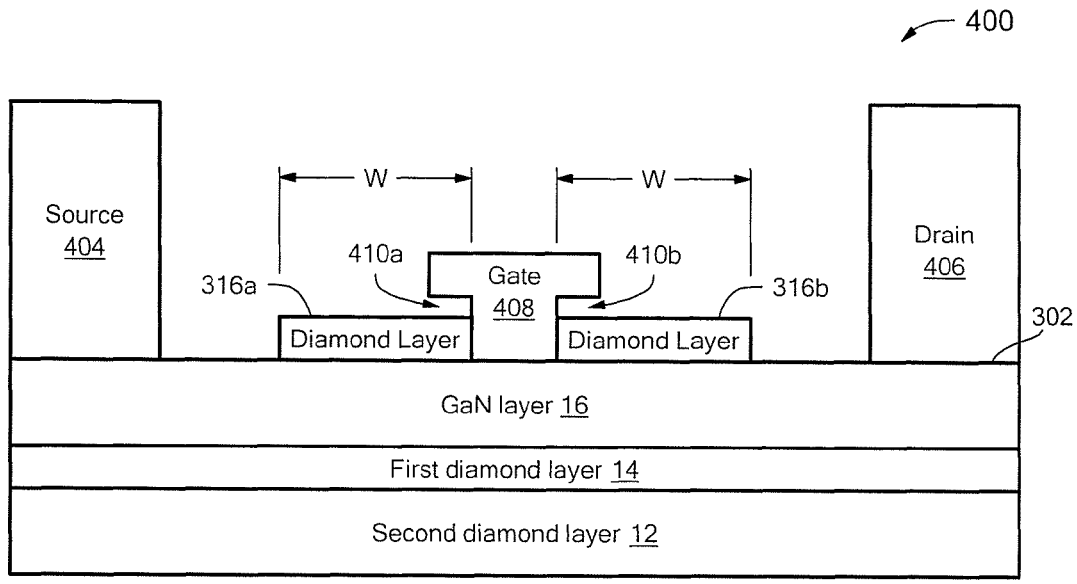
FIG. 10 is an example of a device with diamond layers.

Referring to FIG. 10, the diamond/GaN/diamond/diamond structure 360 may be used to fabricate devices such as a high frequency device, a high electron mobility transistor (HEMT), a microwave device and so forth. For example, the diamond layer 316 may be integrated directly into the devices and used not only to remove heat but function as a dielectric, for example, used in capacitance. For example, the dielectric constant of diamond is about 5.7 which is close to the dielectric constant of about 7 for silicon nitride films commonly used in GaN devices; however, diamond films have a greater thermal conductivity than the silicon nitride films. In some examples, portions of the diamond layer 316 are removed (e.g., using oxygen plasma) and the surface 302 of the GaN 16 becomes exposed.

In one example, a device 400 (e.g., a HEMT device) includes a source 404, a drain 406 and a gate 408 (e.g., a T-Gate) that are deposited in a metallization step onto to the surface 302 of the GaN layer 16. The gate 408 is formed in the diamond layer 316 after removal of portions of the diamond layer thereby exposing the GaN. In this example, the removal of portions of the diamond layer 316 splits the diamond layer into two diamond layers 316a, 316b each having a width W. In this configuration, the diamond layers 316a, 316b may function as a dielectric layer and a heat spreader by removing the heat away from the gate 408. In some examples, the widths of the diamond layers 316a, 316b may not be equal. In one example, portions of the gate 408 are adjacent to and in contact with the diamond layers 316a, 316b and other portions of the gate 408 form gaps 410a, 410b (e.g., air gaps) between the gate and the diamond layers 316a, 316b. In one example, gate 408, the gaps 410a, 410b, the diamond layer 316a, 316b form capacitance structures. One of ordinary skill in the art would be aware of several methods to form these gaps 410a, 410b. For example, prior to metallization to form the gate 408, a material (e.g., photoresist) may be on the surface of the diamond layer 316. After the gate 408 is formed, the material is removed forming the gaps 410a, 410b. In other examples, the device 400 does not include gaps 410a, 410b so that the gate 408 is directly on the surface of the diamond layers 316a, 316b. In still further examples, other materials may fill gaps 410a, 410b that may or may not contribute to capacitance.

Figure 11:
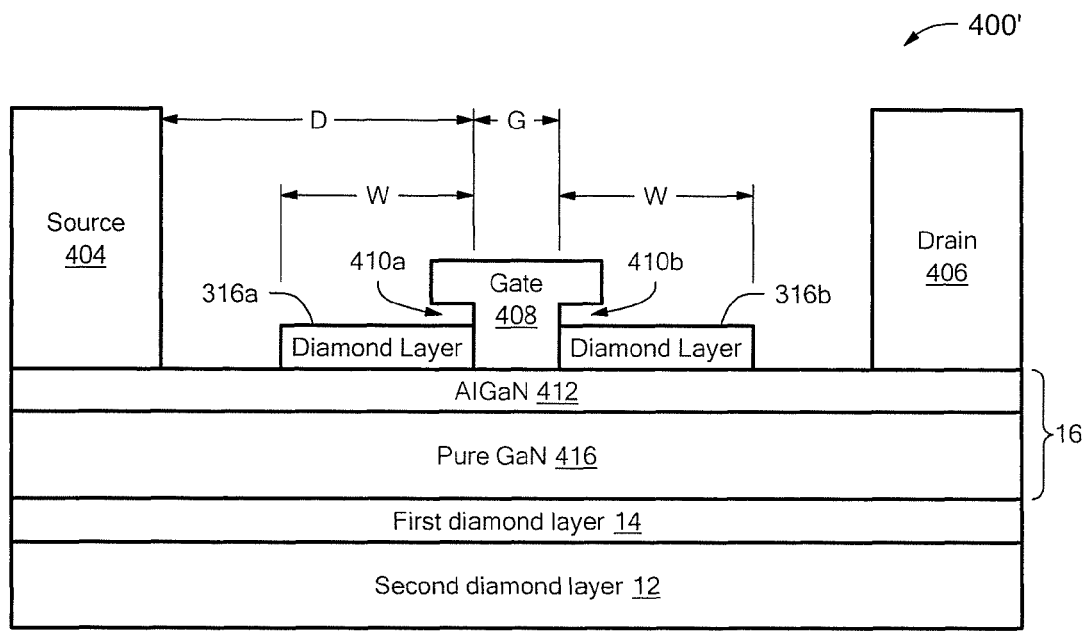
FIG. 11 is another example of a device with diamond layers.
Figure 12:
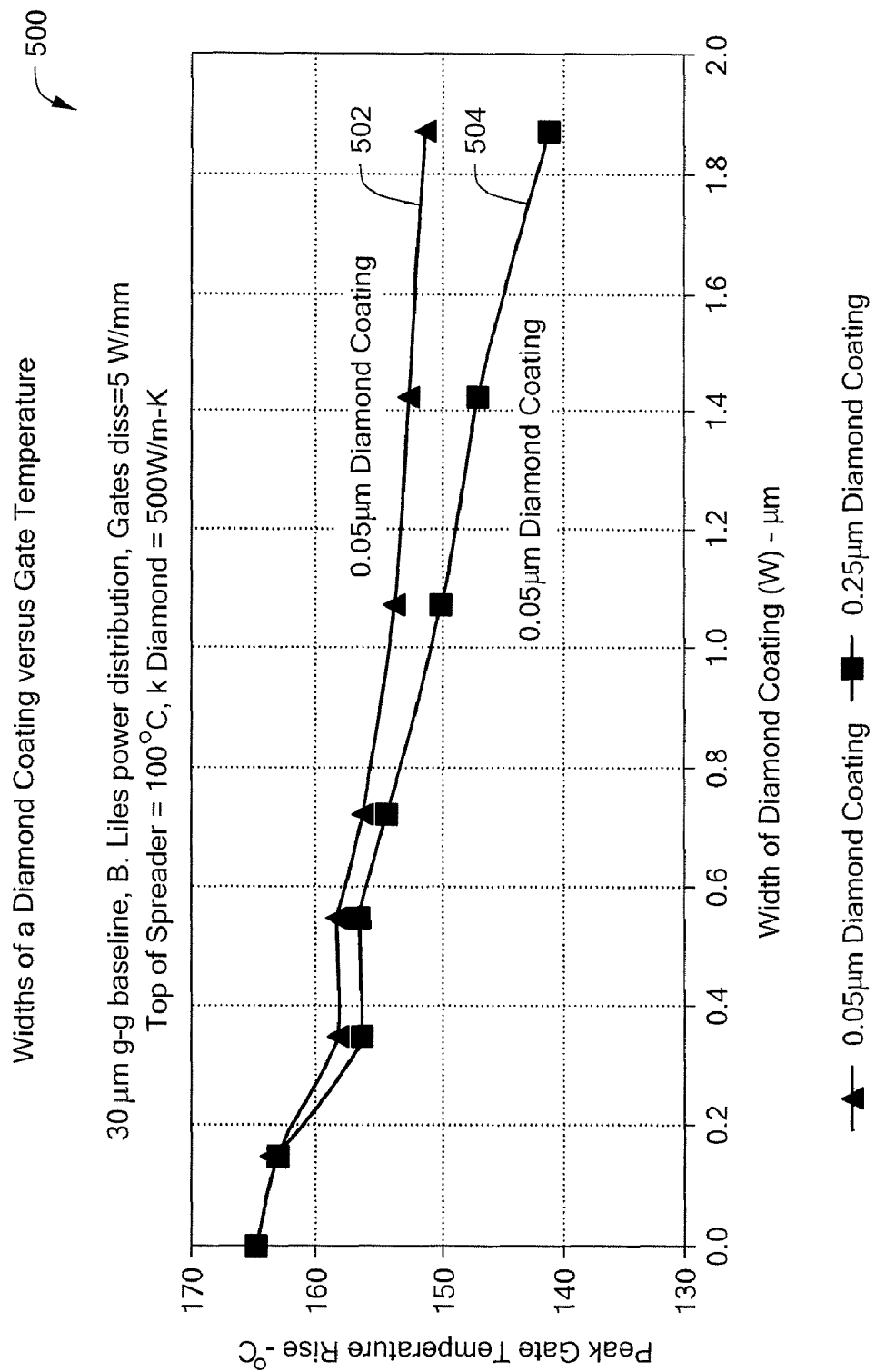
FIG. 12 is a graph depicting thermal performance with diamond coatings.

Referring to FIGS. 11 and 12, a device 400' is similar to the device 400 with the GaN layer 16 including an AlGaN layer 412 and a pure GaN layer 416. Other GaN-type materials may be added to the GaN layer 416 than the AlGaN 412. The GaN layer 416 may also be replaced with doped GaN or other GaN-type materials. The third diamond layers 316a, 316b are used to significantly reduce temperatures at the gate 408 by spreading the heat away from the gate. A graph 500 depicts the effects of heat as a function of the width, W, of the diamond layer 316a or 316b using the device 400'. A distance, D, between the gate 408 and the source 404 is 1.875 microns and a distance, G, between the diamond layers 316a, 316b is 0.25 microns. A curve 502 represents a 0.05 micron layer of diamond and a curve 504 represents a 0.25 micron layer of diamond. The 0.25 micron diamond coating allows a 20% increase in output power and reduces thermal resistance by 15% (>25° C. at 5 W/mm) than not having a diamond layers 316a, 316b. The 0.05 micron diamond coating reduces thermal resistance by 10% (>25° C. at 5 W/mm) than not having a diamond layers 316a, 316b.

The processes described herein are not limited to the specific embodiments described herein. For example, the processes are not limited to the specific processing order of the process steps in FIGS. 2, 4, 6 and 8. Rather, any of the processing steps of FIGS. 2, 4, 6 and 8 may be re-ordered, combined or removed, performed in parallel or in serial, as necessary, to achieve the results set forth above.

While the invention is shown and described in conjunction with a particular embodiment having an illustrative product having certain components in a given order, it is understood that other embodiments well within the scope of the invention are contemplated having more and fewer components, having different types of components, and being coupled in various arrangements. Such embodiments will be readily apparent to one of ordinary skill in the art. Other embodiments not specifically described herein are also within the scope of the following claims.

What is claimed is:

1. A method, comprising:
    fabricating a device comprising:
        a gallium nitride (GaN) layer;
        a first diamond layer disposed on the GaN layer; and
        a gate structure disposed in contact with the GaN layer and the first diamond layer,
    wherein the fabricating comprises:
        depositing a first diamond layer onto a first surface of the GaN; and
        disposing a second diamond layer onto a second surface of the GaN layer opposite the first surface of the GaN layer.

2. The method of claim 1 wherein the depositing comprises depositing the diamond layer onto the GaN layer using a microwave plasma chemical vapor deposition (CVD).

3. The method of claim 1 wherein the depositing comprises depositing a diamond layer that is greater than 1,000 Angstroms.

4. The method of claim 1 wherein disposing a second diamond layer onto a second surface of the GaN layer opposite the first surface of the GaN layer comprises attaching to the second surface of the GaN layer a second diamond layer having a first thermal conductivity and a third diamond layer disposed thereto having a second thermal conductivity greater than the first thermal conductivity.

5. The method of claim 1 wherein fabricating a device comprising the GaN layer comprises fabricating a device comprising a GaN layer comprising at least one of undoped GaN, doped GaN or GaN combined with another element.

6. The method of claim 1 wherein fabricating a device comprises fabricating one of a high frequency device, a high electron mobility transistor (HEMT) or a microwave device.

7. A method comprising:
    disposing a diamond layer onto a first surface of gallium nitride (GaN);
    removing a portion of the diamond layer exposing the first surface of the GaN;
    forming a gate structure in contact with the first surface of the GaN and the diamond layer; and
    attaching a second diamond layer to a second surface of the GaN opposite the first surface of the GaN.

8. The method of claim 7, further comprising fabricating at least one of a high frequency device, a high electron mobility transistor (HEMT) or a microwave device from the diamond/GaN structure.

9. The method of claim 7 wherein removing a portion of the diamond layer exposing the GaN surface comprises removing a portion of the diamond layer using oxygen plasma.

10. The method of claim 7 wherein disposing a diamond layer comprises depositing a diamond layer.

11. The method of claim 10, further comprising performing an ultrasound on the GaN immersed in a solution comprising nano-diamond particles prior to depositing the diamond layer.

12. The method of claim 7, further comprising:
    growing GaN on a first substrate;
    disposing a layer of material onto the GaN; and
    removing the first substrate.

13. The method of claim 12 wherein growing GaN on a first substrate comprises growing GaN on one of silicon carbide, silicon or sapphire.

14. The method of claim 12 wherein disposing a layer of material onto the GaN comprises disposing one of a silicon layer or a glass layer.

15. The method of claim 12, further comprising removing the layer of material to form a diamond/GaN structure.

* * * * *